(12) United States Patent
Patapoutian et al.

(10) Patent No.: US 8,996,963 B2
(45) Date of Patent: Mar. 31, 2015

(54) BUFFER MANAGEMENT USING SIDE INFORMATION

(71) Applicant: Seagate Technology LLC, Cupertino, CA (US)

(72) Inventors: Ara Patapoutian, Hopkinton, MA (US); Hieu Nguyen, Superior, CO (US)

(73) Assignee: Seagate Technology LLC, Cupertino, CA (US)

( * ) Notice: Subject to any disclaimer, the term of this patent is extended or adjusted under 35 U.S.C. 154(b) by 262 days.

(21) Appl. No.: 13/675,177

(22) Filed: Nov. 13, 2012

(65) Prior Publication Data

US 2014/0136917 A1    May 15, 2014

(51) Int. Cl.
  *H03M 13/00*  (2006.01)
  *G11C 29/00*  (2006.01)
  *H03M 13/37*  (2006.01)
  *G06F 11/10*  (2006.01)

(52) U.S. Cl.
  CPC ........... *H03M 13/37* (2013.01); *G06F 11/1012* (2013.01)
  USPC .......................................... 714/779; 714/763

(58) Field of Classification Search
  CPC ... G06F 11/1012; H03M 13/37; H03M 13/05; H04L 1/0057
  USPC .......... 714/763, 779, 780, 752, 48, 49, 50, 52
  See application file for complete search history.

(56) References Cited

U.S. PATENT DOCUMENTS

| | | | |
|---|---|---|---|
| 5,867,510 A * | 2/1999 | Steele | 714/758 |
| 6,118,921 A | 9/2000 | Kim | |
| 7,228,064 B2 | 6/2007 | Wada | |
| 7,322,002 B2 * | 1/2008 | Keays et al. | 714/763 |
| 7,747,929 B2 | 6/2010 | Kyung | |
| 8,489,915 B2 * | 7/2013 | Dhuse et al. | 714/6.22 |
| 2013/0145231 A1 * | 6/2013 | Frayer et al. | 714/763 |

* cited by examiner

*Primary Examiner* — Christine Tu
(74) *Attorney, Agent, or Firm* — Mueting, Raasch & Gebhardt, P.A.

(57) ABSTRACT

Devices and/or methods for managing a buffer containing failed data may utilize side information related to the failed data. The side information may include, e.g., a decoding-success score representing an estimated amount of errors and/or a local host requested status for buffered or unbuffered failed data.

20 Claims, 7 Drawing Sheets

BUFFER MANAGEMENT USING SIDE INFORMATION

The disclosure herein relates to the use of side information related to failed data portions to be managed in a buffer, and further to devices for performing and implementing such data management

SUMMARY

One exemplary device (e.g., a data device for use in bit-patterned media systems, heat-assisted magnetic recording systems, solid state storage systems, flash storage systems, etc.) may include a storage medium and a processor. The storage medium may include a plurality of data blocks, or blocks of data, and each of the plurality of data blocks may include a plurality of data portions, or portions of data. The processor, or processing apparatus, may be operably coupled to the storage medium to read data therefrom and may be further configured to read a failed data portion of a data block of the plurality of data blocks of the storage medium and apply one of a variable-length decoding (e.g., low-density parity-check decoding) on the failed data portion and a block-based decoding on the data block (e.g., the data block including the failed data portion) based on side information related to the failed data portion. The side information may include one or more of the following: a decoding-success score (e.g., representing an estimated amount of errors within the failed data portion); a remaining amount of unread data portions of the data block; an amount of requested data portions of the data block; if the failed data portion is buffered; and a decoding status of any previously-failed data portion of the data block.

One exemplary method (e.g., for reading data) may include reading a failed data portion from a data block and applying one of a variable-length decoding (e.g., low-density parity-check decoding) on the failed data portion and a block-based decoding on the data block (e.g., the data block including the failed data portion) based on side information related to the failed data portion. The side information may include one or more of the following: a decoding-success score (e.g., representing an estimated amount of errors within the failed data portion); a remaining amount of unread data portions of the data block; an amount of requested data portions of the data block; if the failed data portion is buffered; and a decoding status of any previously-failed data portion of the data block.

One exemplary storage system may include a plurality of data blocks, each of the data blocks including a plurality of data portions. The exemplary storage system may include a processor configured to read data portions and data blocks and apply one of a variable-length decoding on a failed data portion and a block-based decoding on a data block comprising the failed data portion based on side information related to the failed data portion.

One exemplary device may include a storage medium, a buffer (e.g., a quarantined buffer), and a processor (e.g., processing apparatus). The storage medium may include a plurality of data blocks, or blocks of data, and each of the plurality of data blocks may include a plurality of data portions, or portions of data. The buffer may be configured to store one or more failed data portions. The processor may be operably coupled to the storage medium and the buffer to read data therefrom and write data thereto and may be further configured to read a failed data portion of a data block of the plurality of data blocks of the storage medium and determine whether the failed data portion should be stored in the buffer based on side information related to at least one of the failed data portions and one or more buffered failed data portions within the buffer. The side information may include one or more of the following: a decoding-success score (e.g., representing an estimated amount of errors for each of the failed data portion and the one or more buffered failed data portions within the buffer); and a local host requested status for each of the failed data portion and the one or more buffered failed data portions within the buffer. In at least one embodiment, the processor may be further configured to sort the one or more buffered data portions from a first-to-be-decoded data portion to a last-to-be-decoded data portion based on the side information relating to the one or more buffered failed data portions within the buffer.

One exemplary method for reading data may include reading a failed data portion, or failed portion of data, from a data block, or block of data, and determining whether the failed data portion should be stored in a buffer (e.g., quarantined buffer) based on side information related to at least one of the failed data portions and one or more buffered failed data portions within the buffer. The side information may include one or more of the following: a decoding-success score (e.g., representing an estimated amount of errors for each of the failed data portion and the one or more buffered failed data portions within the buffer); and a local host requested status for each of the failed data portion and the one or more buffered failed data portions within the buffer.

The above summary is not intended to describe each embodiment or every implementation of the present disclosure. A more complete understanding will become apparent and appreciated by referring to the following detailed description and claims taken in conjunction with the accompanying drawings. In other words, these and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings.

DETAILED DESCRIPTION

Exemplary methods and devices shall be described with reference to FIGS. 1-5. It will be apparent to one skilled in the art that elements or processes from one embodiment may be used in combination with elements or processes of the other embodiments, and that the possible embodiments of such methods and devices using combinations of features set forth herein is not limited to the specific embodiments shown in the figures and/or described herein. Further, it will be recognized that timing of the processes and the size and shape of various elements herein may be modified but still fall within the scope of the present disclosure, although certain timings, one or more shapes and/or sizes, or types of elements, may be advantageous over others.

When data is requested by a host from a storage device such as a hard drive, the requested data (e.g., incoming or read data) may be checked to ensure that it is error free. For example, a syndrome, such as an outer code syndrome, may be generated for a portion of requested data to indicate whether it contains errors. Requested data that contains errors (in other words, the requested data is not error free) results in what may be referred to as a data failure (e.g., a portion/sector failure, a block/track failure, etc.). Such requested failed data may then be decoded using various decoding techniques and/or the requested failed data may be attempted to be re-read from the storage medium. The disclosure herein relates to decoding such failed data using block-based and/or variable-length decoding and to managing such failed data portions in a buffer (e.g., a buffer holding quarantined data to be decoding). More specifically, the exemplary methods and devices described herein may utilize side information related to the failed data to choose between performing block-based decoding and/or variable-length decoding and/or to manage the failed data portions located in a buffer (e.g., a quarantined buffer). Such exemplary methods and devices may provide, e.g., increased performance, decreased latency, increased throughput, etc.

Figure 1A:
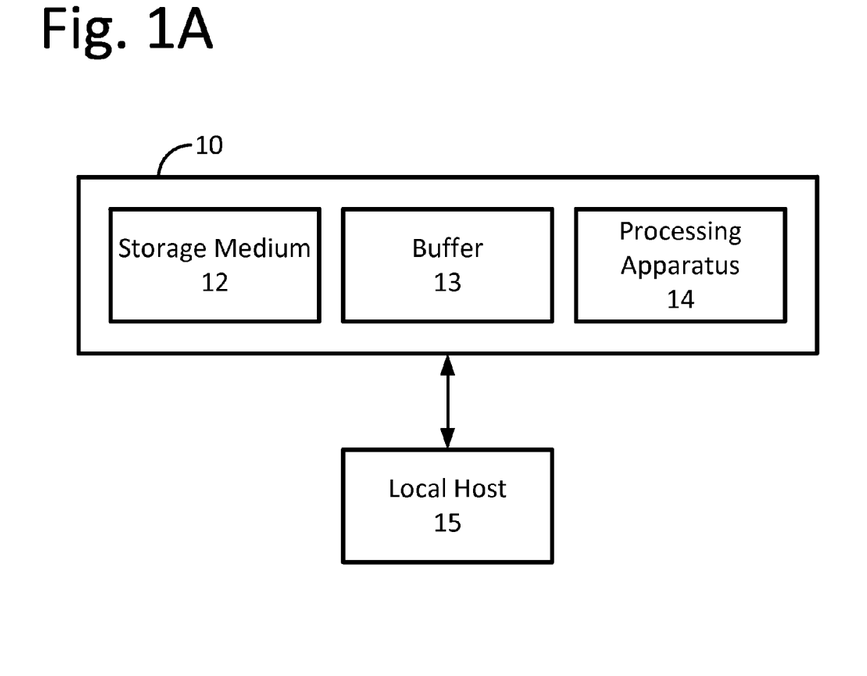
FIGS. 1A-1C are block diagrams including an exemplary device for use in reading and decoding data and/or managing a buffer.
Figure 1B:
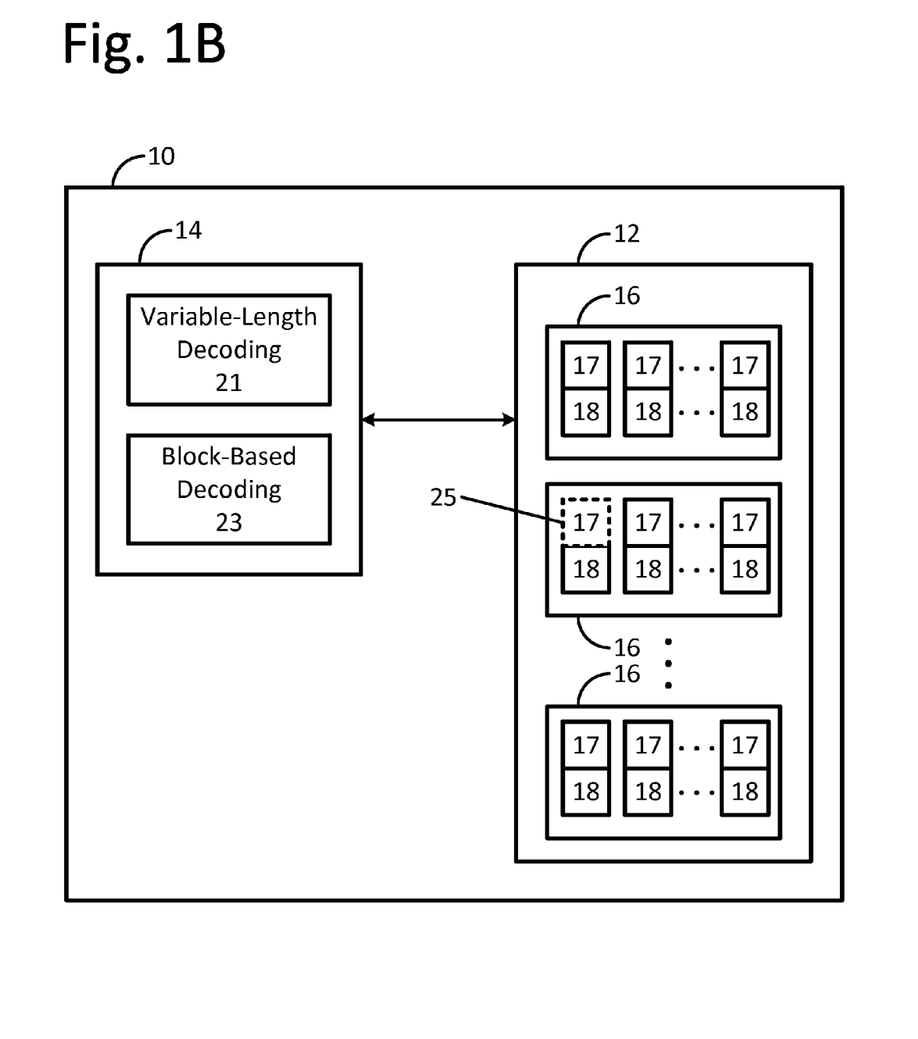
Figure 1C:
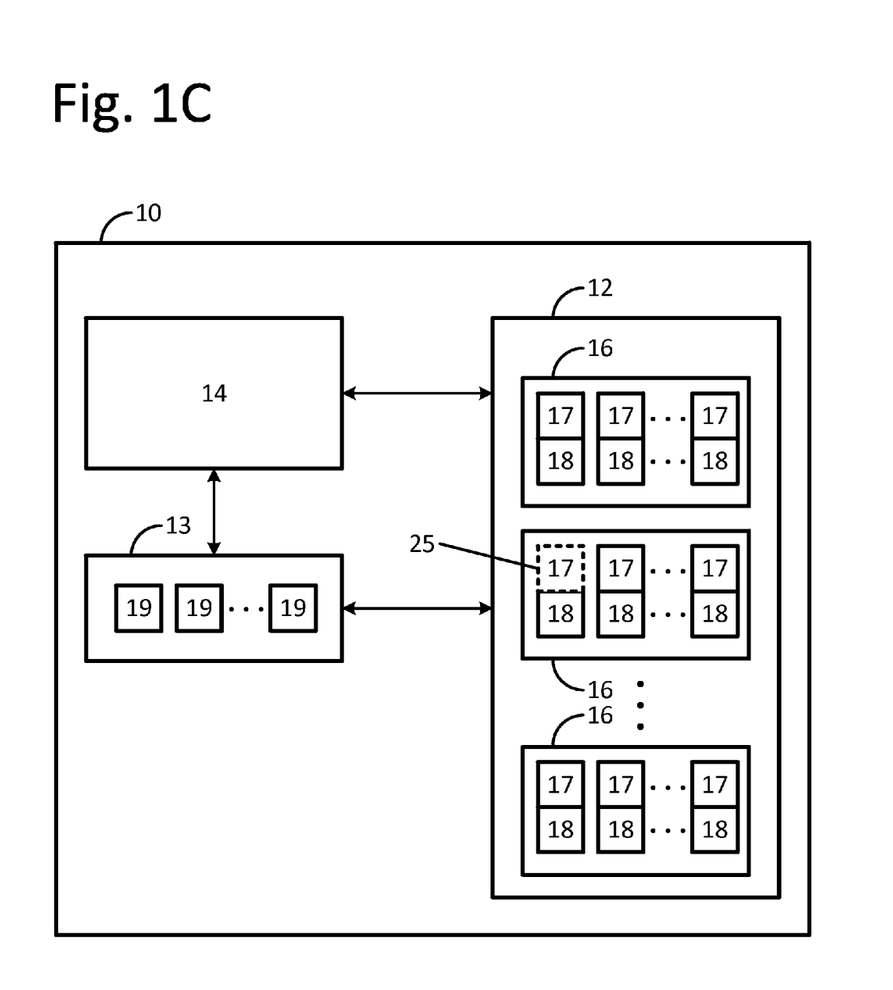

Exemplary devices 10 (e.g., data device) that can be used in the embodiments described herein are depicted in FIGS. 1A-1C. The exemplary devices 10 may be operably coupled to a local host 15, e.g., for transferring data therebetween, as shown in FIG. 1A. For example, the local host 15 may request data from the device 10 and the device 10 may provide such requested data to the local host 15. In at least one embodiment, the local host 15 is a computer (such as, e.g., a personal computer, server, etc.). The device 10 includes a storage medium 12, a buffer 13 (e.g., for temporarily storing data during read and write operations), and a processor, or processing apparatus, 14 that are operably coupled (e.g., electrically coupled to transmit data therebetween) to each other. The methods and devices disclosed herein may be generally described in the context of exemplary device 10 and/or systems includes exemplary device 10, but that should in no way be taken as limiting the scope of the present disclosure. Generally, a device 10 may be any device and/or apparatus in which data may be written to the storage medium 12 and then read back from the storage medium 12.

The storage medium 12 may be any device and/or apparatus configured to store a plurality of data blocks, or tracks of data, 16 (e.g., binary data), each block 16 containing a plurality of data portions, or sectors of data, 17. The storage medium 12 can include, but is not necessarily limited to, solid state memory, hard magnetic discs, floppy discs, magnetic tapes, optical discs, integrated circuits, volatile memory, non-volatile memory, etc. Generally, the plurality of data blocks, or blocks of data, 16 may be contained in non-volatile memory.

Non-volatile memory may include any kind of computer memory that can retain information stored thereon when not powered. Examples of non-volatile memory that may be utilized as the non-volatile main memory include, but are not limited to, read only memory (ROM), flash memory, hard drives, and random access memory (RAM). Examples of ROM include, but are not limited to, programmable ROM (PROM) which can also be referred to as field programmable ROM; electrically erasable programmable ROM (EEPROM) which is also referred to as electrically alterable ROM (EAROM); and erasable programmable ROM (EPROM). Examples of RAM include, but are not limited to, ferroelectric RAM (FeRAM or FRAM); magnetoresistive RAM (MRAM); resistive RAM (RRAM); non-volatile static RAM (nvSRAM); battery backed static RAM (BBSRAM); phase change memory (PCM) which is also referred to as PRAM, PCRAM and C-RAM; programmable metallization cell (PMC) which is also referred to as conductive-bridging RAM or CBRAM; nano-RAM (NRAM), spin torque transfer RAM (STTRAM) which is also referred to as STRAM; and Silicon-Oxide-Nitride-Oxide-Silicon (SONOS), which is similar to flash RAM.

Each data block, or block of data, 16 of the plurality of data blocks 16 of the storage medium 12 may be generally described as including a plurality of data portions, or cells, 17. For example, each block 16 of data may be subdivided in a plurality of data portions, or cells, 17. As defined herein, each data portion, or cell, 17 is the basic unit of data storage on the storage medium 12. In at least one embodiment, for example, in connection with a magnetic disc, a data block 16 may be referred to as a "track," and a data portion, or cell, 17 may be referred to as a "sector."

Each data portion, or cell, 17 in a data block 16 may include one or more bits or bytes. In at least one embodiment, each data portion, or cell, 17 in a data block contains 4096 bytes of data. In at least one embodiment, each data portion, or cell, 17 in a data block 16 contains a single bit of data. In at least one embodiment, a data block 16 can be contained in a plurality of memory cells. The number of data portions, or cells, 17 within a data block 16 may depend at least in part on the size of the data block 16.

In at least one embodiment, the storage medium 12 may include one or more magnetic discs. Each disc in an exemplary storage medium 12 may include a surface having a plurality of substantially concentric circular tracks (e.g., blocks 16 of data), or data tracks. In some embodiments, the data tracks on a magnetic disc-based storage medium 12 are logically divided into a plurality of data storage sectors or portions 17. Each storage sector may be identified and located at various positions on disc. In the disc-type storage medium example illustrated, the sectors, may be "pie-shaped" angular sections of a track that are bounded on two sides by radii of the disc and on the other side by the perimeter of the circle that defines the track.

The processor 14 may include various circuitry, logic, memory, etc. for use in the reading, writing, and decoding data from the storage medium 12 and/or managing data within the buffer 13. For example, the processor 14 may include one or more circuit components such as integrated circuits, processors, etc. that may be configured to interface with the storage medium 12 and the buffer 13 to read and write data therein. Among other things, the processor 14 may be configured to decode one or more data portions 17 and/or data blocks 16 read from the storage medium 12 that are determined to have "failed," or contain data failures. For example, as shown, one data portion 17 is indicated to have failed by dashed lines 25. The failed data portion 17, 25 may be read/received by the buffer 13 and/or processor 14 for decoding using the processes and algorithms described herein. In other words, the processor 14 may be used for carrying out data recovery from the storage medium 12. These read/write operations executed by the processor 14 may be performed directly on the storage medium 12 or through an optional read/write channel. The read/write channel may be configured to receive data from the processor 14 during a write operation, and provides encoded write data to the storage medium 12. During a read operation, the read/ write channel may process a read signal in order to detect and decode data recorded on the storage medium 12.

The methods, techniques, and/or processes described in this disclosure, including those attributed to the processor, or various constituent components, may be implemented, at least in part, in hardware, software, firmware, or any combination thereof. For example, various aspects of the techniques may be implemented within one or more processors, including one or more microprocessors, DSPs, ASICs, FPGAs, or any other equivalent integrated or discrete logic circuitry, as well as any combinations of such components. The term "processing apparatus," "processor," or "processing circuitry" may generally refer to any of the foregoing logic circuitry, alone or in combination with other logic circuitry, or any other equivalent circuitry.

Such hardware, software, and/or firmware may be implemented within the same device or within separate devices to support the various operations and functions described in this disclosure. In addition, any of the described units, modules, or components may be implemented together or separately as discrete but interoperable logic devices. Depiction of different features as modules or units is intended to highlight different functional aspects and does not necessarily imply that such modules or units must be realized by separate hardware or software components. Rather, functionality associated with one or more modules or units may be performed by separate hardware or software components, or integrated within common or separate hardware or software components.

When implemented in software, the functionality ascribed to the systems, devices and techniques described in this disclosure may be embodied as instructions on a computer-readable medium such as RAM, ROM, NVRAM, EEPROM, FLASH memory, STRAM, RRAM, magnetic data storage media, optical data storage media, or the like. The instructions may be executed by one or more processors to support one or more aspects of the functionality described in this disclosure.

Generally, data may read and decoded from the storage medium 12 in at least two different operations, or modes, such as on-the-fly (OTF) operation where throughput is a key metric and no major data failures occur and error recovery operation where data reliability is a key metric where all recovery algorithms/mechanisms may be used, or performed, to recover the data failures without concern for throughput loss.

As shown in FIG. 1B and further described herein, the exemplary methods and/or devices may utilize one or both of variable-length decoding 21 and block-based decoding 23 to decode failed data during on-the-fly operation.

As used herein, variable-length decoding 21 may be defined as a technique that may use one or more algorithms and/or processes that may take a variable length of time to decode the failed data (e.g., failed data may be a read data portion including one or more errors). As opposed to block-based decoding 23, which may only decode an entire data block (e.g., one of data blocks 16), variable-length decoding 21 may be used on data pieces smaller than an entire data block such as portions (e.g., smaller chunks, one or more data portions 17, etc.) of the data block. Variable-length decoding 21 may decode the failed data in a shorter amount of time, or a longer amount of time, e.g., depending on how many errors exist in the failed data. Exemplary variable-based decoding processes or techniques may include, e.g., forward error correction codes, low-density parity check (LDPC) codes, turbo codes, etc.

Further, variable-length decoding 21 may include iterative decoding, such as LDPC decoding. Such iterative decoding may not decode the failed data after a predetermined number (e.g., one, two, five, ten, etc.) of iterations of decoding and may require additional iterations of decoding. In other words, some data portions may be harder to recover or decode using iterative decoding, and therefore, may take a longer amount of time for convergence of the iterative decoding algorithm to, e.g., fix the errors in the failed data portion.

In at least one embodiment, variable-length decoding 21 may only be used when the portions of failed data are buffered (e.g., stored in a quarantined buffer). Often, for example, when a decoder becomes available, failed data portions stored with a buffer are decoded, or reprocessed, using variable-length decoding, e.g., under more relaxed time constraints (which may, e.g., be referred to as deferred decoding).

As used herein, block-based decoding 23 may be defined as a decoding technique that may use one or more algorithms and/or processes for decoding a data block (e.g., an entire data block including more than one data portion). Exemplary block-based decoding algorithms and/or processes may utilize, e.g., Reed-Solomon codes, Hamming codes, single parity codes, interleaved codes, LDPC codes, etc. For example, block-based codes (for use in block-based decoding), such as outer codes (OC), may have the capability to correct a single or multiple sector/portion failures, irrespective of the type of the failure. Often, for example, block-based decoding 23 is used during error recovery. Block-based decoding 23 may be further useful during on-the-fly (OTF) operation for both sequential-read and random-read operations. For example, the use of block-based decoding in OTF may translate to areal density gains, when throughput is the bottleneck to increase areal density.

During OTF operation, it may be useful to combine both block-based decoding 23 and variable-length decoding 21. Exemplary methods and devices described herein utilize both block-based decoding 23 and variable-length decoding 21 during OTF operation. Such exemplary methods and devices may utilize side information (e.g., decoding-success scores, the remaining amount of unread portions for a block, whether the failed data portion is buffered, the amount of requested portions from a block, whether the failed data portion is from a block already being decoded, etc.) for use in determining whether block-based decoding 23 or variable-length decoding 21 should be used.

As described further herein, side information 18 may be associated with, and related to, each data portion 17 of each data block 16. As shown in FIGS. 1B-1C, the side information 18 may be stored on the storage medium 12 and transmitted to the processor 14 such that, e.g., the processor 14 may decide whether to use block-based decoding 23 and/or variable-length decoding 21 on the failed data as shown in FIG. 1B. Further, failed data portions 19 may be stored in the buffer 13 (e.g., in a portion of the buffer which may be referred to as the quarantined buffer, a quarantined buffer separate from one or more typical data buffers, etc.) as shown in FIG. 1C.

Figure 2:
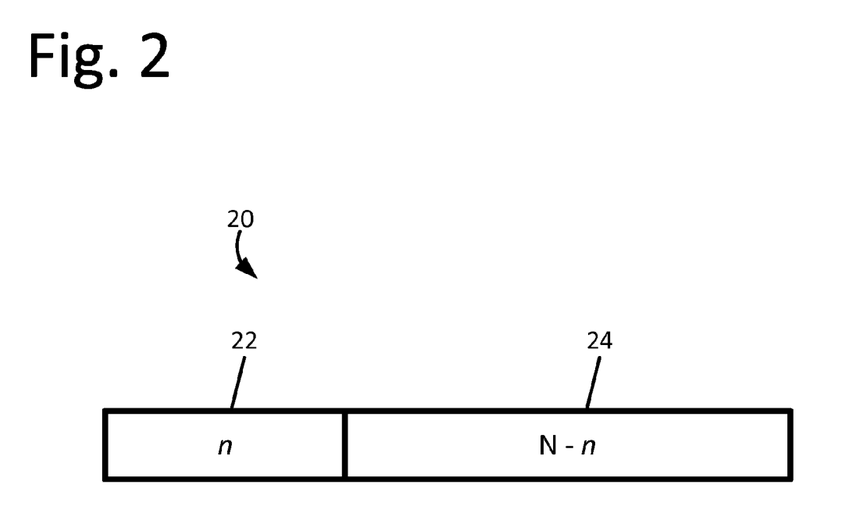
FIG. 2 is a diagrammatic representation of data block, e.g., to be read and decoded by the exemplary devices and methods described herein such as the devices of FIGS. 1A-1C.

An exemplary read and decode operation is depicted in FIG. 2. For example, n requested portions 22 are read from a block 20 with at least one failed data portion (e.g., portion, or sector, containing at least one error). Presently, it may not be possible to perform variable-length decoding without disabling block-based decoding since, e.g., the newly arriving portions from a block 20 cannot be decoded because the decoder is busy decoding deferred portions. In other words, if the decoder is busy processing the quarantined portions/sectors, the decoder will not be able to simultaneously also process the incoming portions/sectors that are needed for block-based decoding. As such, the following two options may exist: (1) perform variable-length decoding and disable block-based decoding (e.g., because the decoder is busy); or (2) read the entire block 20 and perform block-based decoding, and possibly variable-length decoding.

Each of options (1) and (2) may have disadvantages. For example, if option (1) fails, then a re-read must occur (e.g., because the block-based decoding was disabled). Further, for example, option (2) may always have an associated performance loss because the entire data block 20 must be read.

Exemplary methods and devices described herein may use dynamic, side information related to one or more failed data portions (e.g., failed portions of data) to, e.g., realize the combined gains of block-based decoding and variable-length decoding. For example, the exemplary methods and devices may intelligently choose between option (1) and option (2) as described herein with reference to FIG. 2 using such side information related to one or more failed data portions.

One exemplary piece of side information may be a decoding-success score for each data portion of the plurality of data portions in each of the plurality of data blocks. The decoding-success score for a data portion may represent, or estimate, the amount of errors within the data portion. In at least one embodiment, the decoding-success score may represent the signal-to-noise ratio for the data portion. The decoding-success score may be used to determine whether a particular failed data portion may be decoded using variable-length decoding. For example, a higher decoding-success score may represent a lower amount of errors and a higher likelihood of successful decoding using variable-length decoding, and a lower decoding-success score may represent a higher amount of errors and a lower likelihood of successful decoding using variable-length decoding. Further, for example, a higher decoding-success score may represent a shorter amount of time variable-length decoding may take to decode the failed data portion, and a lower decoding-success score may represent a longer amount of time variable-length decoding may take to decode the failed data portion.

In at least one embodiment, the decoding-success score for each data portion can be obtained from a detector (e.g., Viterbi detector, Bahl, Cocke, Jelinek and Raviv (BCJR) decoder, etc.). For example, soft output detector values (LLRs) can be used to estimate the decoding-success score. In at least one embodiment, the decoding-success score can be estimated by reconstructing an ideal waveform using detector decisions and then estimating a signal-to-noise ratio by subtracting the received waveform from the ideal waveform. In at least one embodiment, the decoding-success score can also be modified based on how many (e.g., an amount) variable-length decoding iterations have been performed on the portion previously. If less iterations were performed (e.g., due to limited availability of the decoder), then the decoding-success score for that portion could be incrementally increased.

Figure 3:
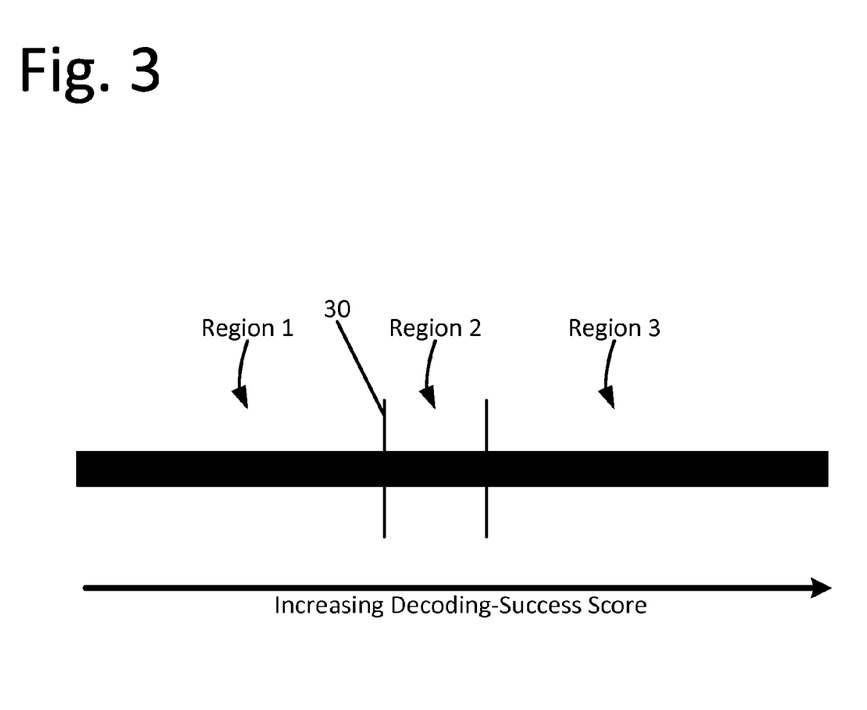
FIG. 3 is a graph depicting different regions of decoding-success scores for use by the exemplary devices and methods described herein such as the devices of FIGS. 1A-1C.

As shown in FIG. 3, decoding-success scores may be separated into three regions along an axis of increasing decoding-success scores from left to right. Failed data portions having decoding-success scores in Region 1 will not be able to be completely decoded using variable-length decoding (e.g., even with an infinite amount of iterations), and thus, when a failed data portion has a decoding-success score in Region 1, the entire block containing the failed data portion must be read and decoded using block-based decoding. Failed data portions having decoding-success scores in Region 3 may be decoded on-the-fly using typical decoding techniques/algorithms, e.g., without any additional decoding over an extended period of time such as during variable-length decoding. Failed data portions having decoding-success scores in Region 2 may not be decoded on-the-fly using typical decoding techniques/algorithms and may be decoded using variable-length decoding (e.g., variable-length decoding over an extended period of time, variable-length decoding over multiple iterations, etc.).

To optimize throughput, variable-length decoding may be maximized and block-based decoding may be minimized (e.g., to avoid the overhead of reading an entire data block prior to performing the block-based decoding). To do so, generally, failed data portions having decoding-success scores located in Region 2 may be delegated to variable-length decoding, and failed data portions having decoding-success scores located in Region 1 may be delegated to block-based decoding. This may be advantageous because variable-length decoding may have practically no impact on performance (e.g., if decoded in less time than it would take to read the entire block, etc.) and block-based decoding must first read all the portions in a block prior to decoding, which may impact performance (e.g., unless in sequential read mode).

Another exemplary piece of side information may be the remaining amount of unread portions 24 of the block 20 being read as shown in FIG. 2. If the remaining amount of unread portions 24 of the block 20 being read is small, it may be advantageous to finish reading the rest of the block 20 (e.g., the entire block) and decode the entire block 20 using block-based decoding. For example, as shown in FIG. 2, if the remaining portions 24 in a block 20, i.e., (N-n), is small, then block-based decoding should be used (e.g., irrespective of the decoding-success score and/or any other side information), since, e.g., the performance penalty of reading a small amount of remaining portions 24 in the block 20 may be very small.

Another exemplary piece of side information may be whether the failed data portion is buffered (e.g., completely buffered). Sometimes, the buffer (e.g., a quarantined buffer for holding, or storing, failed data portions to be decoded) may become full, and failed data portions may not be buffered (e.g., stored in the quarantined buffer). If the failed data portion is not buffered, it may not be decoded using variable-length decoding, and thus, if the failed data portion is not buffered, then the entire data block within which the failed data portion is located should be read and decoded using block-based decoding.

Another exemplary piece of side information may be an amount of requested data portions in a given data block. If an amount of requested data portions in a given data block is greater than (e.g., greater than or equal to) a lower threshold, then block-based decoding should be attempted. If the amount of requested data portions in a given block is less than (e.g., less than or equal to) a lower threshold, then variable-length decoding should be used, e.g., since the performance penalty for reading a large amount of unrequested data portions from the given block may be large.

Still another exemplary piece of side information may be the decoding status of any previously-failed data portion (i.e., previously-read portions including data failures) of the same block as the presently-failed data portion (i.e., presently-read portion including data failures). For example, if a previously failed data portion is already being decoded using block-based decoding, the presently failed data portion will also be decoded using block-based decoding at the same time (e.g., since the entire block is being decoded). As such, if a previously-failed data portion is being decoded using block-based decoding, any decoding of the presently-failed data portion may be halted since it is already being decoded due to the previously-failed data portion being decoded used block-based decoding.

Figure 4:
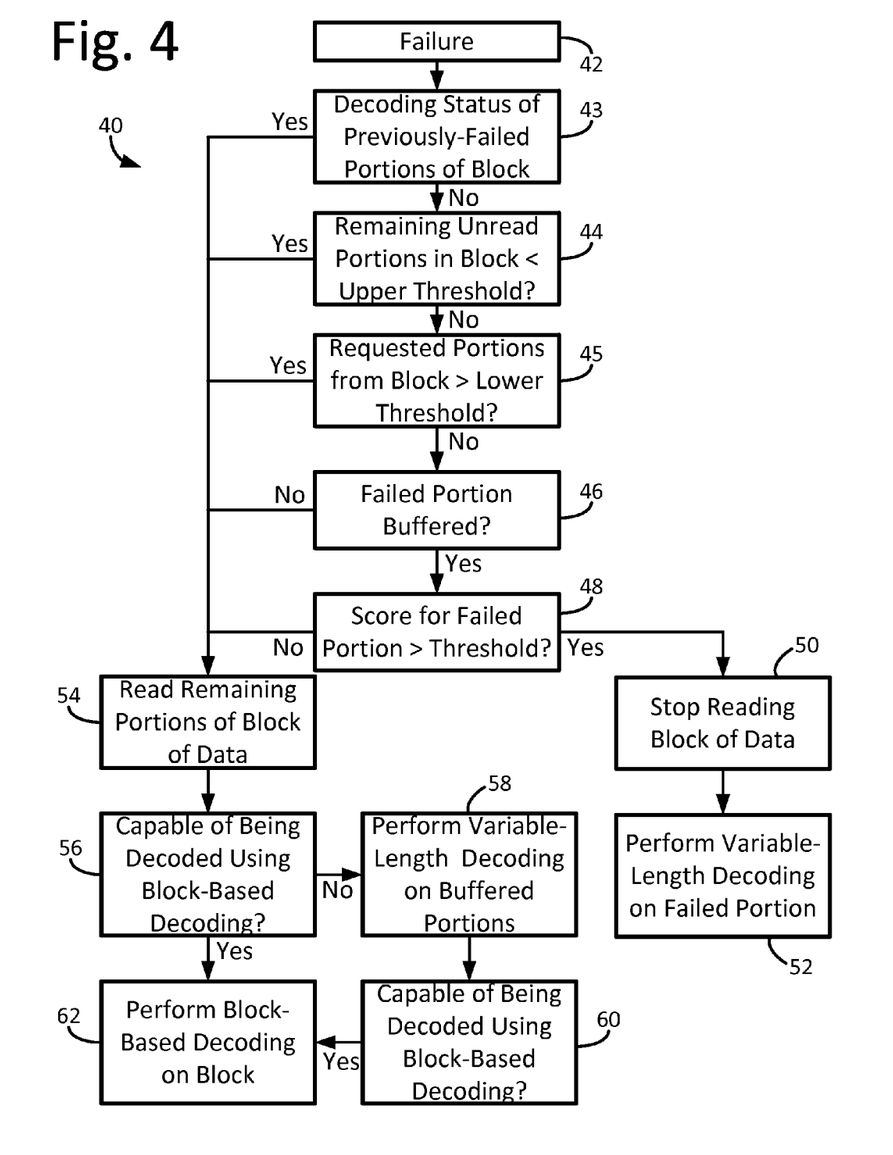
FIG. 4 is a flow diagram of an exemplary method of reading data from a storage medium and decoding failed data.

An exemplary method 40 for reading and decoding data using such exemplary pieces of side information is depicted in FIG. 4. Generally, exemplary method 40 may utilize both of variable-length decoding and block-based decoding to decode one or more failed data portions depending on one or more pieces of side information related to the one or more failed data portions. The side information may include the decoding status of previously-failed data portions 43, the remaining unread portions in the data block 44, the requested portions in the block 45, whether the failed data portion is buffered 46, and/or the decoding-success score for the failed data portion 48. Although the exemplary method 40 depicts five sequential processes 43, 44, 45, 46, 48 that each evaluate different side information, the exemplary method 40 may include one or more of such side information evaluation processes 43, 44, 45, 46, 48 and further may arrange such one or more processes 43, 44, 45, 46, 48 in any order. In at least one embodiment, the processes 43, 44, 45, 46, 48 may be executed simultaneously.

For example, after a failed data portion is detected 42, the method 40 may check the decoding status of any previously-failed data portion within the same data block as the previously-failed data portion 43. If any previously-failed data portions within the same data block as the presently-failed data portion are being decoded using block-based decoding (e.g., for any reason such as a variable-length decoding failure, a low decoding-success score, etc.), then the method 40 may proceed to reading the remaining portions in the data block 54 (e.g., such that the entire data block has been read) and to performing block-based decoding on the entire data block 62 (e.g., after one or more various processes as described further herein). If any previously-failed data portions within the same data block as the presently-failed data portion are not being decoded using block-based decoding (e.g., for any reason such as a high decoding-success score, etc.), then the method 40 may stop reading the data block 50 and perform variable-length decoding on the failed data portion 52 (e.g., after the additional evaluation processes 44, 45, 46, 48).

Further, for example, after a failed data portion is detected 42, the method 40 may determine the remaining amount of unread portions of the block including the failed data portion 44 (such as, e.g., the remaining unread portions 24 of block 20 as shown in FIG. 2). If the amount of unread portions is less than (e.g., less than or equal to) a remaining unread portions upper threshold value, then the method 40 may proceed to reading the remaining portions in the data block 54 (e.g., such that the entire data block has been read) and to performing block-based decoding on the entire data block 62 (e.g., after one or more various processes as described further herein). If the amount of unread portions is greater than (e.g., greater than or equal to) a remaining unread portions upper threshold value, then the method 40 may stop reading the data block 50 and perform variable-length decoding on the failed data portion 52 (e.g., after the additional evaluation processes 43, 45, 46, 48).

The remaining unread portions upper threshold value may be a preset value (e.g., set by a user) intended to provide high performance for decoding failed data using variable-length decoding and block-based decoding. As described herein, the amount of time it takes for variable-length decoding to decode a failed data portion may vary. In some situations, variable-length decoding may decode the failed data portion quickly (e.g., in the first pass, or iteration, of decoding), and in other situations, variable-length decoding may decode a failed data portion more slowly (e.g., after multiple iterations). As such, the remaining unread portions upper threshold value may represent a balance between the performance of variable-length decoding on the failed data portion 52 (and/or any other failed data portion within the same block) and reading the remaining portions of the block 54 and decoding the data block using block-based decoding 62.

The remaining unread portions upper threshold value may be set to a value such that an amount of time (e.g., estimated amount of time) it may take to read the remaining unread portions 54 of the block containing the failed data portion and to decode the data block 62 (e.g., the entire data block) using block-based decoding is less than or equal to the amount of time it may take to decode all of the failed data portions in the data block using variable-length decoding 52.

Further, for example, after a failed data portion is detected 42, the method 40 may determine the amount of requested portions of the block including the failed data portion 45. If the amount of requested portions is greater than (e.g., greater than or equal to) a requested portions lower threshold value, then the method 40 may proceed to reading the remaining portions in the data block 54 (e.g., such that the entire data block has been read) and to performing block-based decoding on the entire data block 62 (e.g., after one or more various processes as described further herein). If the amount of requested portions is less than (e.g., less than or equal to) a requested portions lower threshold value, then the method 40 may stop reading the data block 50 and perform variable-length decoding on the failed data portion 52 (e.g., after the additional evaluation processes 43, 45, 46, 48).

The requested portions lower threshold value may be a preset value (e.g., set by a user) intended to provide high performance for decoding failed data using variable-length decoding and/or block-based decoding. As described herein, the amount of time it takes for variable-length decoding to decode a failed data portion may vary. As such, similar to the remaining unread upper threshold value, the requested portions lower threshold value may represent a balance between the performance of variable-length decoding on the failed data portion and the other requested failed data portions within the same data block 52 and reading the remaining portions of the block 54 and decoding the data block (e.g., entire data block) using block-based decoding 62.

The requested portions lower threshold value may be set to a value such that an amount of time (e.g., estimated amount of time) it may take to read the data block 54 (e.g., the entire data block) containing the failed data portion and to decode the data block 62 (e.g., the entire data block) using block-based decoding is less than or equal to the amount of time it may take to decode all of the requested failed data portions in the data block using variable-length decoding 52 (e.g., including the time it may take for additional re-reads if the variable-length decoding fails).

Further, as noted herein, the side information may include whether the failed data portion is buffered 46. Variable-length decoding may only be available if the failed data portion is buffered, and as such, if the failed data portion is not buffered (e.g., because the buffer is full, etc.), then block-based decoding, instead of variable-length decoding, may be performed on the block including the failed data portion. For example, after a failed data portion is detected 42, the method 40 may determine if the failed data portion is buffered 46 (e.g., stored in a quarantined buffer). If the failed data portion is not buffered, the method 40 may proceed to reading the remaining portions of the data block containing the failed data portion 54 and performing block-based decoding on the data block 62 (e.g., after one or more various processes as further described herein). If the failed data portion is buffered, then the method 40 may stop reading the data block 50 and perform variable-length decoding on the failed data portion 52 (e.g., after the additional evaluation processes 43, 44, 45, 48).

Still further, as noted herein, the side information may include a decoding-success score for the failed data portion. As previously described, a higher decoding-success score may represent a lower amount of errors and a higher likelihood of successful decoding using variable-length decoding, and a lower decoding-success score may represent a higher amount of errors and a lower likelihood of successful decoding using variable-length decoding. The exemplary method 40 may utilize a variable-length decoding threshold value to evaluate the decoding-success score to determine whether to apply variable-length decoding to the failed data portion and/or block-based decoding to the block containing the failed data portion 48.

The variable-length decoding threshold value may provide an indication of whether the failed data portion may be decoded using variable-length decoding. For example, if the decoding-success score for the failed data portion is greater than (e.g., greater than or equal to) the variable-length decoding threshold value, then it is likely that the failed data portion may be decoded using variable-length decoding. Conversely, if the decoding-success score for the failed data portion is less than (e.g., less than or equal to) the variable-length decoding threshold value, then it is likely that the failed data portion may not be decoded using variable-length decoding (and thus, the block containing the failed data portion should be decoded using block-based decoding). As shown in FIG. 3, the variable-length decoding threshold value may be represented by the line 30 separating Region 1 and Region 2.

As such, the exemplary method 40 may evaluate the decoding-success score for the failed data portion and determine whether the decoding-success score is greater than (e.g., greater than or equal to) the variable-length decoding threshold value 48. If the decoding-success score is less than (e.g., less than or equal to) the variable-length decoding threshold value, then the method 40 may proceed to reading the remaining portions of the data block containing the failed data portion 54 and to performing block-based decoding on the data block 62 (e.g., after one or more various processes as further described herein). If the decoding-success score is greater than (e.g., greater than or equal to) the variable-length decoding threshold value, then the method 40 may stop reading the data block 50 and perform variable-length decoding on the failed data portion 52 (e.g., after the additional evaluation processes 43, 44, 45, 46).

The exemplary method 40 may further include a few additional processes after determining to read the remaining portions of the data block 54 and to decode the data block (e.g., the entire data block) using block-based decoding 62. More specifically, one or more processes may occur after the data block has been read 54 and before the data block is decoded using block-based decoding 62. For example, in certain situations (e.g., when the data block has many errors), the data block may not be capable of being decoded by block-based decoding. As such, after the data block has been read 54, the method 40 may evaluate (e.g., to determine the number or amount of errors within the entire data block, etc.) the data block to determine whether it is capable of being decoding using block-based decoding 56. For example, the block-based decoding may only be able to correct a selected number of errors in the data block, and therefore, the number of errors detected in the data block may be compared against the capability of the block-based code. In other words, the block-based decoding may have error-correction capability (e.g., an amount of errors within the block that the block-based decoding is capable of recovering or correcting), and the number of errors within the present data block may be compared to the error-correction capability of the block-based decoding.

If the block is capable of being decoded by block-based decoding (e.g., the block-based decoding is operable to correct the number of errors detected in the data block), the method 40 may proceed to performing block-based decoding on the data block 62. If the data block is not capable of being decoded by block-based decoding (e.g., the data block has, or contains, more errors than the block-based decoding is capable of correcting or recovering), the method 40 may proceed to performing variable-length decoding on the portions of the block that have been buffered 58. In other words, buffered portions of the data block may be decoded using variable-length decoding 58 (e.g., to correct the errors therein). Although the variable-length decoding may not fix or recover all the errors within the one or more buffered failed data portions of the block, the decoding may fix or recover enough of the errors such that block-based decoding may be capable of decoding the data block (e.g., due to the decrease in errors in the data block). Then, after the at least a data portion of the one or more buffered data portions have been decoded (or attempted at being decoded) using variable-length decoding 58, the data block may again be evaluated to determine whether it is capable of being decoded using block-based decoding 60. If the data block is now capable of being decoded using block-based decoding (e.g., after one or more data portions of the data block have been decoded using variable-length decoding 58 leaving the data block with fewer data failures), the method 40 may proceed to performing block-based decoding on the data block 62 (e.g., the entire data block).

Although not represented in FIG. 4, if either block-based decoding 62 or variable-length decoding 52 fails (e.g., is incapable of decoding the failed data), then the method 40 may force a re-read of the data from the storage medium. The use of processes, or steps, 56, 58, 60 may allow a block of failed data that was incapable of being decoded by variable-length decoding by itself or block-based decoding by itself to be decoded using variable-length decoding and block-based decoding together to avoid a re-read from the storage medium. In general, variable-length decoding may be used to correct or recover enough errors within portions of the data block such that the data block may be capable of being decoded by the block-based decoding. In at least one embodiment, the exemplary method may only use variable-length decoding to decode the minimum amount of errors with the data block that allows block-based decoding to decode the data block (e.g., the entire data block).

As described herein, a device (e.g., data device) may include a buffer, or quarantined buffer, to store failed data portions, or portions of data, to, e.g., be decoded using variable-length decoding on a deferred basis (as opposed to OTF). The size of the buffer may be limited due to cost (e.g., area, power, etc.). Consequently, it may be desired to store only the failed data portions that variable-length decoding may successfully decode within the buffer. In other words, to maximize storage efficiency, buffer space may not be used for failed data portions that variable-length decoding cannot address, or decode.

Further, quarantined buffers in present data devices may not be managed. For example, all failed data portions may be treated the same and stored in a quarantined buffer on a first come, first serve basis. In other words, no failed data portions may be differentiated based on any information with respect to the failed data portions. Further, if the quarantined buffer becomes full, then all additional incoming failed data portions may not be stored in the buffer.

Since quarantined buffers are not cost-free and have limited space, it may be beneficial to use them in an efficient way. The exemplary methods and devices described herein may use dynamic, side-information related to one or more failed data portions stored in the buffer (e.g., quarantined buffer) to, e.g., to intelligently and efficiently manage the buffer content.

One exemplary piece of side information that may be used to manage a buffer is a decoding-success score for each failed data portion stored in the buffer. As described herein, the decoding-success score for a data portion, or portion of data, may represent, or estimate, the amount of errors within the data portion, and may be used to predict the likelihood that the data portion may be successfully decoded using variable-length decoding. If the decoding-success score of the incoming (e.g., presently read) failed data portion is greater than (e.g., greater than or equal to) any other failed data portion in the buffer, then the incoming failed data portion may be stored in the buffer while a buffered failed data portion (e.g., failed data portion already located in the buffer) with a lower score may be discarded (e.g., since it has a lower likelihood of successful or efficient decoding using variable-length decoding). In at least one embodiment, the buffered failed data portion discarded may have the lowest decoding-success score in the entire buffer (e.g., all of the quarantined buffer).

Another exemplary piece of side information that may be used to manage a buffer (e.g., quarantined buffer) is the local host requested status for each failed data portion stored in the buffer. Such local host requested status may be stored in a flag, or variable, associated with each failed data portion (e.g., stored as metadata). For example, local host requested data portions may take priority over non-local host requested data portions. If the incoming failed data portion is local-host requested and any other failed data portion in the buffer is not local host requested, then the incoming failed data portion may be stored in the buffer while a buffered failed data portion that was not local host requested may be discarded (e.g., since the non-local host requested data portion may not have priority over a local host requested data portion).

In other words, using the exemplary side information described herein such as, e.g., decoding-success score and local host requested statuses, it may be determined whether an incoming, or read, failed data portion should be stored in the buffer (e.g., quarantined buffer).

Further, the contents (e.g., failed data portions) within the buffer (e.g., quarantined buffer) could be re-sorted based on such exemplary side information (e.g., to provide more efficient evaluation of a new failed data portion in comparison to the buffered failed data portions). For example, failed data portions within the buffer may arranged by which failed data portions get decoded first such as a queue from the first failed data portion to be decoded to the last failed data portion to be decoded. More specifically, the buffer may be sorted, or arranged, by priority with the failed data portions having the highest likelihood of successful and efficient decoding and/or being local host requested being given the highest priority (e.g., to be decoded before portions having a lower priority) and the failed data portions having a lower likelihood of successful and efficient decoding and not being local host requested being given a lower priority (e.g., to be decoded after data portions having a higher priority).

Figure 5:
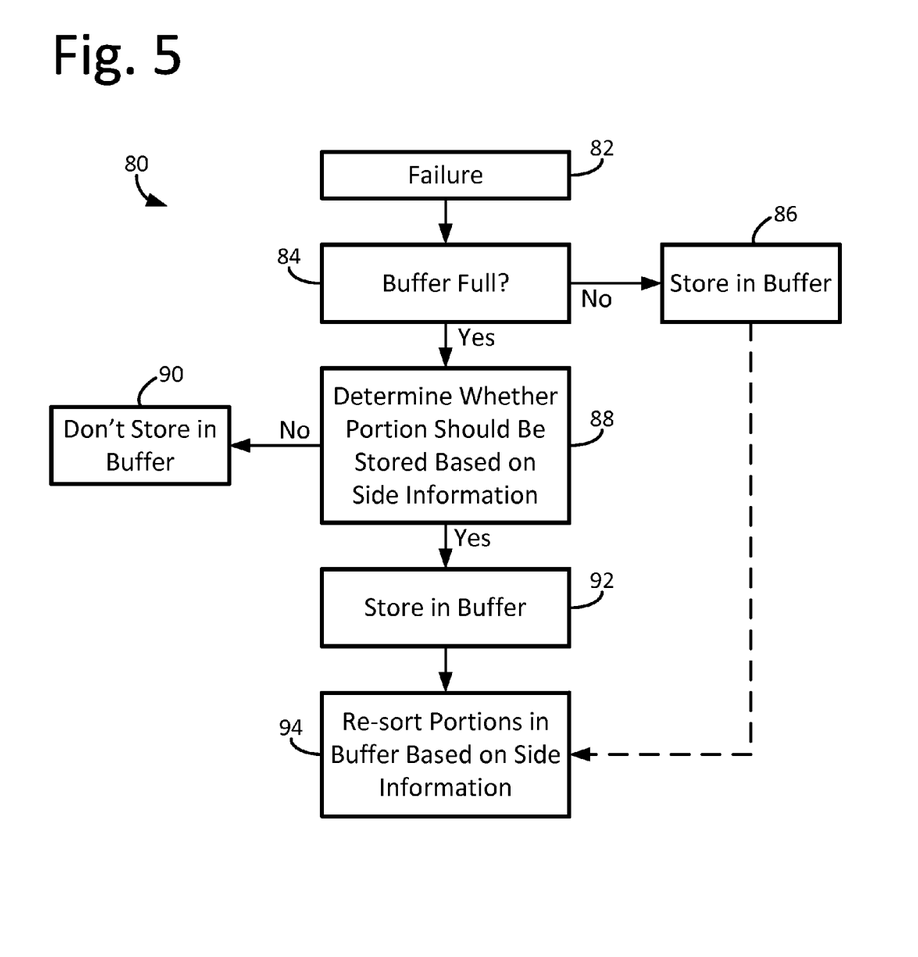
FIG. 5 is a flow diagram of an exemplary method of managing a buffer for use in decoding failed data.

An exemplary method 80 of managing a buffer (e.g., quarantined buffer) for failed data that uses exemplary side information is depicted in FIG. 5. As shown in FIG. 5, after a failed data portion is detected 82 (e.g., read and/or received by a processor, or processing apparatus), the method 80 may determine, or check, if the buffer is presently full 84. If the buffer is not full, the method 80 may store the failed data portion in the buffer 86, e.g., to be decoded by variable-length decoding. The status of buffer, which may be either full or open to receive more failed data portions, may be considered a piece of side information.

If the buffer is not full, the method 80 may proceed to determine whether the failed data portion should be stored based on one or more pieces of side information 88. In other words, the method 80 may either store 92 or not store 90 the failed data portion in the buffer based on side information. As described herein, such side information may include a decoding-success score for each failed data portion (e.g., unbuffered and/or buffered data portions) and local host requested status for each failed data portion. For example, if the decoding-success score for the incoming failed data portion is greater (e.g., greater than or equal) to a decoding-success score of any one or more of the failed data portions already located in the buffer (e.g., buffered failed data portions), the incoming, or read, failed data portion may be stored 92 in the buffer while a buffered failed data portion having a lower decoding-success score may be discarded, or removed from the buffer. In at least one embodiment, the buffered failed data portion having the lowest decoding-success score in the entire buffer (e.g., all of the quarantined buffer) may be discarded. Likewise, if the decoding-success score for the incoming failed data portion is less than (e.g., less than or equal) a decoding-success score of all of the failed data portions already located in the buffer (e.g., buffered failed data portions), the incoming, or read, failed data portion may not be stored 90 in the buffer.

Further, for example, if the incoming, or read, failed data portion has been requested by the local host, the incoming, or read, failed data portion may be stored in the buffer 92 while a buffered failed data portion that has not been requested by the local host may be discarded or removed. In at least one embodiment, if all the buffered failed data portions have been local host requested, then the incoming, or read, failed data portion may not be stored in the buffer 92.

In one or more embodiments, more than one piece of side information may be used to determine whether an incoming, or read, failed data portion should be stored in the buffer. For example, both the decoding-success score and the local host requested status may be used to determine whether the incoming, or read, failed data portion should be stored in the buffer. Further, one piece of side information may take priority, or precedence, over another piece of side information. In at least one embodiment, the local host requested status may take precedence, or priority, over the decoding-success score. In at least one embodiment, the decoding-success score may take precedence, or priority, over the local host requested status.

The method 80 may further include sorting, or re-sorting, the buffered failed data portions in the buffer based on the aforementioned side information 94. For example, the failed data portions in the buffer may be ordered from the first to the last failed data portion to be decoded. In other words, the failed data portions in the buffer may be in a queue from the first failed buffered data portion to be decoded to the last failed buffered data portion to be decoded.

Decoding-success score for each failed data portion may be used to sort, or resort, the buffer. For example, the failed data portions, or portions of data, including a higher decoding-success score may be decoded more quickly and/or have a higher likelihood of decoding success than the failed data portions having a lower decoding-success score. As such, the failed data portions in the buffer may be sorted, or arranged, in order of decoding-success score such that the failed data portions having a higher decoding-success score may be first in line to be decoded (e.g., decoded before failed data portions having lower decoding-success scores).

Further, the local host requested status for each failed data portion may be used to sort, or resort, the buffer. For example, failed data portions that were local host requested may be sorted, or arranged, such that the local host requested failed data portions are decoded first (e.g., in front, or before, the non-local host requested failed data portions).

In the preceding description, reference is made to the accompanying set of drawings that form a part hereof and in which are shown by way of illustration several specific embodiments. It is to be understood that other embodiments are contemplated and may be made without departing from (e.g., still falling within) the scope or spirit of the present disclosure. The preceding detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g., 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

Embodiments of the systems, apparatus, and methods for decoding failed data and managing a buffer are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A device comprising:
    a storage medium comprising a plurality of data blocks, wherein each of the data blocks comprises a plurality of data portions;
    a buffer configured to store one or more buffered failed data portions; and
    a processor operably coupled to the storage medium and the buffer and configured to:
        receive a failed data portion of one of the data blocks from the storage medium; and
        determine whether the failed data portion should be stored in the buffer based on side information related to at least one of the failed data portion and said one or more buffered failed data portions within the buffer.

2. The device of claim 1, wherein the buffer is quarantined.

3. The device of claim 1, wherein the side information comprises a decoding-success score representing an estimated amount of errors for each of the failed data portion and the one or more buffered failed data portions within the buffer, wherein the processor is further configured to store the failed data portion in the buffer if the decoding-success score of the failed data portion is greater than a decoding-success score of any of the one or more buffered failed data portions.

4. The device of claim 3, wherein the processor is further configured to remove a buffered failed data portion of the one or more buffered failed data portions having the lowest decoding-success score.

5. The device of claim 1, wherein the side information comprises a local host requested status for each of the failed data portion and the one or more buffered failed data portions within the buffer, wherein the processor is further configured to store the failed data portion in the buffer if the failed data portion has been requested by the local host and if a buffered failed data portion of the one or more buffered failed data portions has not be requested by the local host.

6. The device of claim 5, wherein the processor is further configured to remove the buffered failed data portion of the one or more buffered failed data portions that has not been requested by the local host.

7. The device of claim 1, wherein the processor is further configured to sort the one or more buffered data portions from a first-to-be-decoded data portion to a last-to-be-decoded data portion based on the side information relating to the one or more buffered failed data portions within the buffer.

8. The device of claim 7, wherein the processor is further configured to sort the one or more buffered failed data portions based at least one of a decoding-success score and a local host requested status.

9. A method:
    receiving a failed data portion of a data block; and
    determining whether the failed data portion should be stored in a buffer based on side information related to at least one of the failed data portion and one or more buffered failed data portions within the buffer.

10. The method of claim 9, wherein the side information comprises a decoding-success score representing an estimated amount of errors for each of the failed data portion and the one or more buffered failed data portions within the buffer, wherein the method further comprises storing the failed data portion in the buffer if the decoding-success score of the failed data portion is greater than a decoding-success score of any of the one or more buffered failed data portions.

11. The method of claim 10, wherein the method further comprises removing a buffered failed data portion of the one or more buffered failed data portions having the lowest decoding-success score.

12. The method of claim 9, wherein the side information comprises a local host requested status for each of the failed data portion and the one or more buffered failed data portions within the buffer, wherein the method further comprises storing the failed data portion in the buffer if the failed data portion has been requested by the local host and if a buffered failed data portion of the one or more buffered failed data portions has not be requested by the local host.

13. The method of claim 12, wherein the method further comprises removing the buffered failed data portion of the one or more buffered failed data portions that has not been requested by the local host.

14. The method of claim 9, wherein the method further comprises sorting the one or more buffered data portions from a first-to-be-decoded data portion to a last-to-be-decoded data portion based on the side information relating to the one or more buffered failed data portions within the buffer.

15. A device for storing a plurality of data blocks, each of the data blocks comprising a plurality of data portions, the device comprising:
- a buffer configured to store one or more buffered failed data portions; and
- a processor operably coupled to the buffer and configured to:
  - receive a failed data portion of one of the data blocks; and
  - determine whether the failed data portion should be stored in the buffer based on side information related to at least one of the failed data portion and one or more buffered failed data portions within the buffer.

16. The device of claim 15, wherein the side information comprises a decoding-success score for each of the failed data portion and the one or more buffered failed data portions within the buffer, wherein the processor is further configured to store the failed data portion in the buffer if the decoding-success score of the failed data portion is greater than a decoding-success score of any of the one or more buffered failed data portions.

17. The device of claim 16, wherein the processor is further configured to remove the buffered failed data portion of the one or more buffered failed data portions having the lowest decoding-success score.

18. The device of claim 15, wherein the side information comprises a local host requested status for each of the failed data portion and the one or more buffered failed data portions within the buffer, wherein the processor is further configured to store the failed data portion in the buffer if the failed data portion has been requested by the local host and if a buffered failed data portion of the one or more buffered failed data portions has not be requested by the local host.

19. The device of claim 18, wherein the processor is further configured to remove the buffered failed data portion of the one or more buffered failed data portions that has not be requested by the local host.

20. The device of claim 15, wherein the processor is further configured to sort the one or more buffered failed data portions from a first-to-be-decoded data portion to a last-to-be-decoded data portion based on the side information relating to the one or more buffered failed data portions within the buffer.

* * * * *